United States Patent [19]
Hamada

[11] Patent Number: 5,470,763
[45] Date of Patent: Nov. 28, 1995

[54] METHOD FOR MANUFACTURING THIN FILM TRANSISTOR WITH SHORT HYDROGEN PASSIVATION TIME

[75] Inventor: Koji Hamada, Tokyo, Japan

[73] Assignee: NEC Corporation, Tokyo, Japan

[21] Appl. No.: 308,447

[22] Filed: Sep. 19, 1994

[30] Foreign Application Priority Data

Sep. 21, 1993 [JP] Japan .................................. 5-234710

[51] Int. Cl.⁶ .......................... H01L 21/336; H01L 21/30
[52] U.S. Cl. .............................. 437/21; 437/41; 437/937; 257/66
[58] Field of Search ................................ 437/21, 937, 41; 257/66

[56] References Cited

U.S. PATENT DOCUMENTS

| | | | |
|---|---|---|---|
| 4,943,837 | 7/1990 | Konishi et al. | 437/21 |
| 5,225,356 | 7/1993 | Omura et al. | 437/21 |
| 5,250,444 | 10/1993 | Khan et al. | 437/247 |

FOREIGN PATENT DOCUMENTS

| | | | |
|---|---|---|---|
| 1-61062 | 3/1989 | Japan | 437/937 |
| 4-33331 | 2/1992 | Japan | 437/21 |
| 4-349637 | 12/1992 | Japan . | |

OTHER PUBLICATIONS

I-Wei Wu et al, "Effects of Trap-State Density Reduction by Plasma Hydrogeneration in Low-Temperature Polysilicon TFT", *IEEE Electronic Device Letters*, vol. 10, No. 3, pp. 123-125, Mar. 1989.

-Wei Wu et al, "Performance of Polysilicon TFT Digital Circuits Fabricated with Various Processing Techniques and Device Architecture", *Proceedings of the SID*, vol. 31/4, pp. 311-316, 1990.

*Primary Examiner*—Mary Wilczewski
*Attorney, Agent, or Firm*—Sughrue, Mion, Zinn, Macpeak & Seas

[57] ABSTRACT

In a method for manufacturing a thin film transistor, a polycrystalline silicon layer, a gate insulating layer, a gate electrode layer, a non-doped insulating layer, and a metal connections layer are formed on a substrate, and then, a hydrogen passivation is carried out. The non-doped insulating layer has a thickness of less than approximately 100 nm.

13 Claims, 9 Drawing Sheets

METHOD FOR MANUFACTURING THIN FILM TRANSISTOR WITH SHORT HYDROGEN PASSIVATION TIME

BACKGROUND OF THE INVENTION

1. Field of the Invention

The present invention relates to a method for manufacturing a polycrystalline silicon thin film transistor (TFT).

2. Description of the Related Art

Polycrystalline silicon TFT's are used in integrated circuits, particularly, load elements of a static random access memory (SRAM) and liquid crystal devices (LCD's).

In a prior art method for manufacturing a TFT, a polycrystalline silicon layer, a gate insulating layer, a gate electrode layer, a non-doped insulating layer, and a metal connection layer are formed on a substrate, and then, a hydrogen, passivation using hydrogenation by plasma discharge is carried out, to thereby reduce trap state densities of the polycrystalline silicon layer and improve the performance of the TFT (see: I-WEI WU et al. "Effect of Trap-State Density Reduction by Plasma Hydrogeneration in Low-Temperature Polysilicon TFT", IEEE ELECTRON DEVICE LETTERS, VOL. 10, No. 3, PP. 123–125, March 1989). This will be explained later in detail.

In the above-described prior art method, however, a time period for carrying out the hydrogen passivation is very long, for example, about 16 hours.

On the other hand, in order to reduce the time period for carrying out the hydrogen passivation, after the polycrystalline silicon layer is exposed to the air, a hydrogen passivation is performed thereupon (see: JP-A-HEI4-349637). In this case, however, the surface of the polycrystalline silicon layer is damaged by plasma, which coarsens the surface thereof.

SUMMARY OF THE INVENTION

It is an object of the present invention to reduce the time period for carrying out the hydrogen passivation in a method for manufacturing a TFT.

According to the present invention, in a method for manufacturing a TFT, where a polycrystalline-silicon layer, a gate insulating layer, a gate electrode layer, a non-doped insulating layer, and a metal connection layer are formed on a substrate, and then, a hydrogen passivation is carried out, the non-doped insulating layer has a thickness of less than approximately 100 nm.

BRIEF DESCRIPTION OF THE DRAWINGS

The present invention will be more clearly understood from the description as set forth below, in comparison with the prior art, with reference to the accompanying drawings, wherein.

DESCRIPTION OF THE PREFERRED EMBODIMENT

Before the description of the preferred embodiment, a prior art method for manufacturing a TFT will now be explained with reference to FIG. 1 (see: the above-mentioned document by I-WEI WU et al.).

Figure 1:
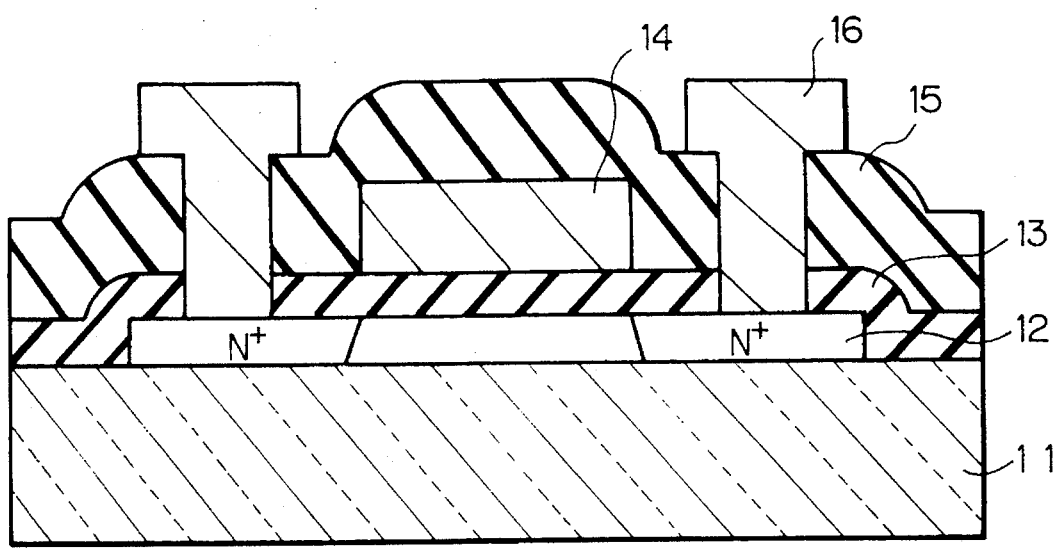
FIG. 1 is a cross-sectional diagram illustrating a prior art TFT.

In FIG. 1, a top-gate type TFT is illustrated. That is, a 100 nm thick amorphous silicon is deposited on a fused quartz substrate 11 by a low pressure chemical vapor deposition (LPCVD) process, and a heat operation is performed thereupon at a temperature of 600° C. for four hours in a nitrogen atmosphere, to thereby form a polycrystalline silicon layer 12. The polycrystalline silicon layer 12 is patterned into an island. Then, a 100 nm thick gate silicon oxide layer 13 is formed, and also, a 350 nm thick polycrystalline silicon gate electrode layer 14 is formed. After the gate electrode layer 14 is patterned, $2 \times 10^{15}$ phosphorous ions/cm² are doped in self-alignment with the patterned gate electrode layer 14, to form source and drain regions in the polycrystalline silicon layer 12. Then, a 700 nm thick non-doped low temperature silicon oxide (LTO) layer 15 is deposited by a LPCVD process, and a heat operation at 600° C. is carried out to anneal the doped impurity ions within the source and drain regions of the polycrystalline silicon layer 12. Thereafter, contact holes are opened within the LTO layer 15 and the gate silicon oxide layer 13, and a 1 μm thick AlSiCu layer 16 is deposited. Then, the device of FIG. 1 is sintered at a temperature of 450° C. for 30 minutes within a forming gas. Finally, a hydrogen passivation is carried out for 16 hours in a parallel-plate plasma reactor at a substrate temperature of 350° C. with an $H_2$ and Ar gas mixture at a power density of 0.21 W/cm² and a frequency of 30 kHz. Thus, the TFT is completed.

Figure 2:
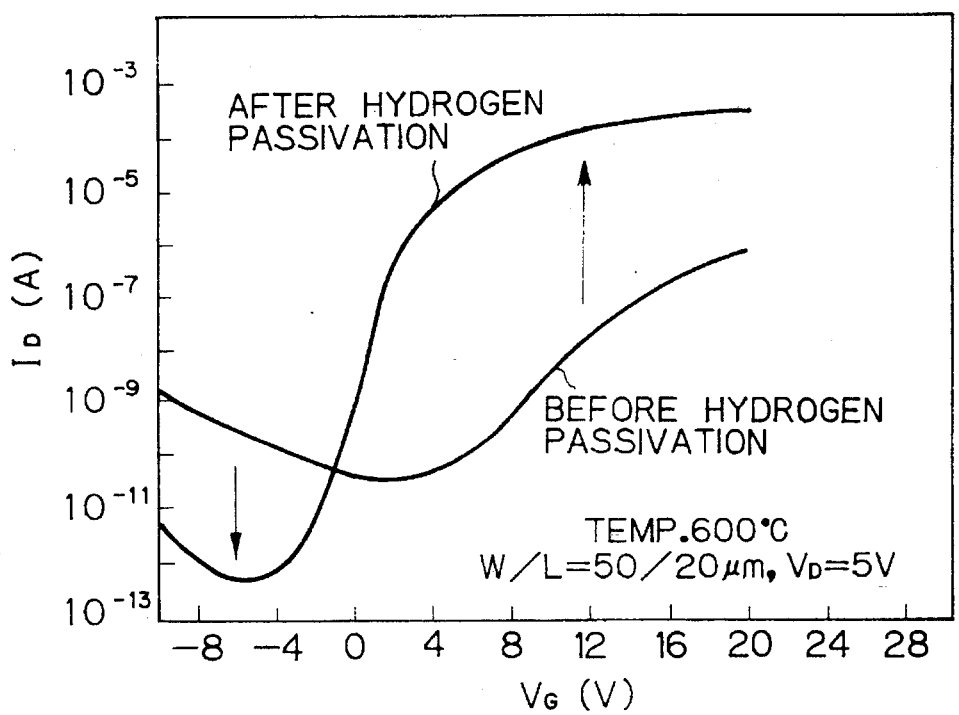
FIG. 2 is a graph showing an $I_D$–$V_G$ characteristic of the TFT of FIG. 1.

In the TFT of FIG. 1, hydrogen atoms can diffuse the 700 nm thick non-doped LTO layer 15 to reach the active channel region of the polycrystalline silicon layer 12. Therefore, as shown in FIG. 2, the drain current ($I_D$)-to-gate voltage ($V_G$) characteristic is improved. That is, an ON current is increased several thousand times and a leakage current is decreased several hundred times. Also, a subthreshold voltage characteristic is improved.

Figure 3:
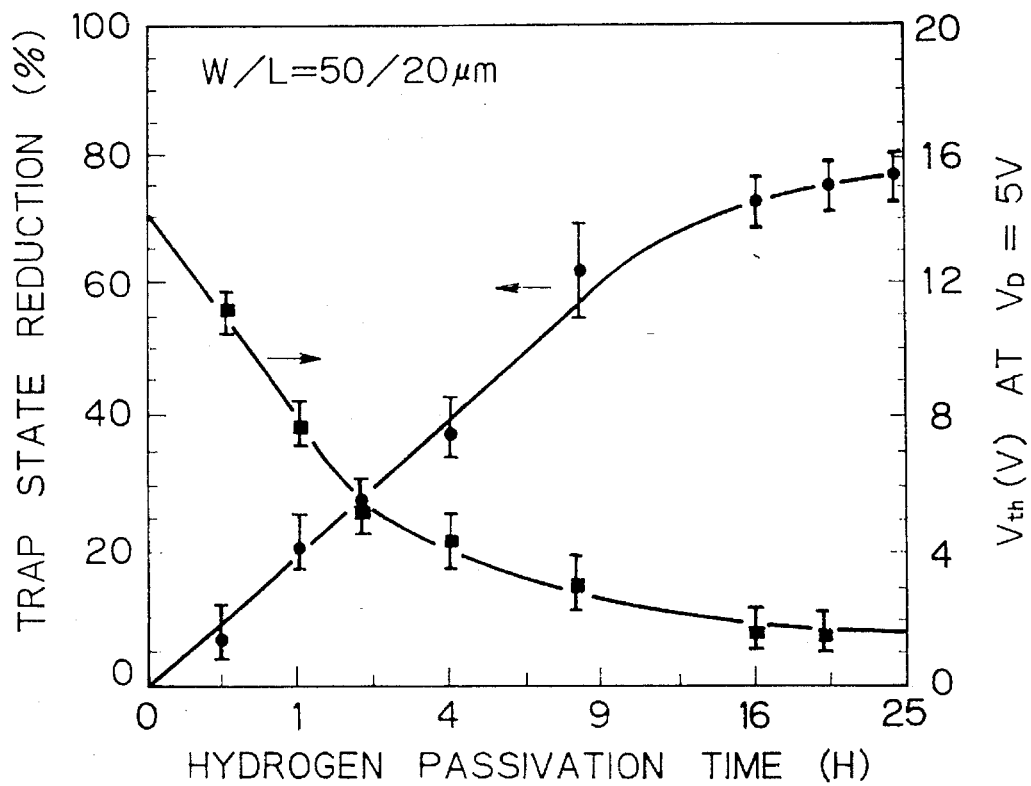
FIG. 3 is a graph showing a trap state reduction characteristic and a threshold voltage characteristic of the TFT of FIG. 1 dependent upon a hydrogen passivation time period.

However, as shown in FIG. 3, which shows the trap state reduction and threshold voltage characteristics of the polycrystalline silicon layer 12, in order to obtain a saturated trap state reduction characteristic and a saturated threshold voltage characteristic, the hydrogen passivation time must be longer than 16 hours, which is very long.

Figure 4A:
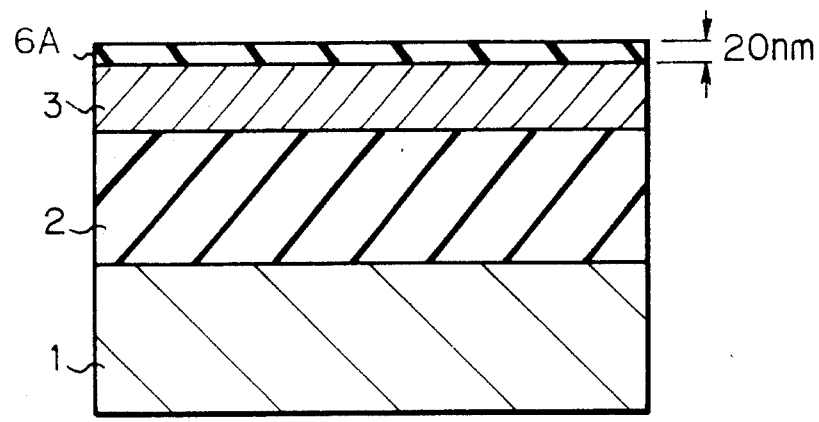
FIGS. 4A, 4B and 4C are cross-sectional views illustrating a principle of the present invention.
Figure 4B:
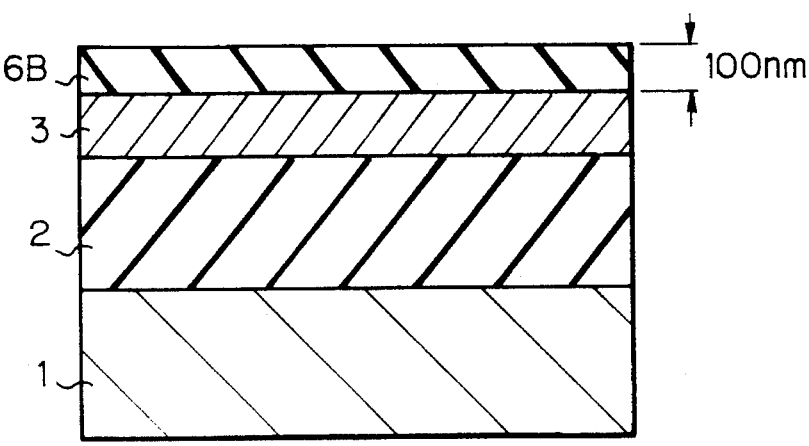
Figure 4C:
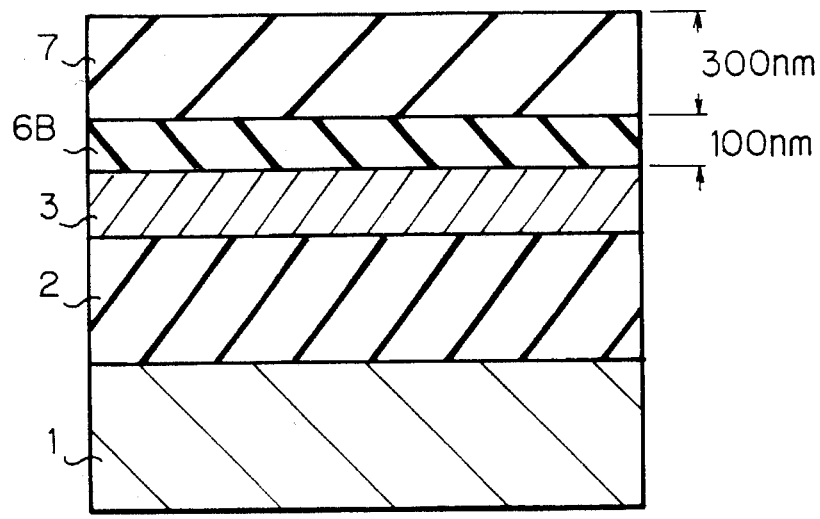

In FIGS. 4A, 4B and 4C, which illustrate a principle of the present invention, an about 600 nm thick silicon oxide layer 2 is grown by thermally oxidizing a monocrystalline silicon substrate 1. Next, an about 100 nm thick amorphous silicon layer is deposited by an LPCVD process at a substrate temperature of about 500° C. with a source gas of $Si_2H_6$, the amorphous silicon is heated for about 12 hours at a temperature of about 600° C. in a nitrogen atmosphere to change the amorphous silicon into a polycrystalline layer 3.

In FIG. 4A, a non-doped HTO layer 6A having a thickness of about 20 nm is formed on the polycrystalline silicon layer 3 by an LPCVD process.

In FIGS. 4B and 4C, a non-doped HTO layer 6B having a thickness of about 100 nm is formed on the polycrystalline silicon layers 3 by an LPCVD process.

Further, in FIG. 4C, an about 300 nm thick boron-included phosphorus silicated glass (BPSG) layer 7 is deposited by an atmospheric pressure CVD (APCVD) process, and a heat operation is carried out for 30 minutes at a temperature of about 900° C., to thereby flatten the BPSG layer 7.

Then, a hydrogen passivation is performed upon the devices of FIGS. 4A, 4B and 4C in a parallel-plate plasma reactor at a substrate temperature of 350° C. with $H_2$ gas at a power density of 0.28 W/cm$^2$ and a frequency of 13.56 kHz.

In order to estimate the amount of hydrogen trapped in the devices of FIGS. 4A, 4B and 4C, the devices are heated by a thermal desorption spectroscopy (TDS) apparatus to about 1150° C., and as a result, hydrogen degassed from the TDS apparatus is analyzed by a quadrapole mass spectrometer. As a result, a hydrogen peak intensity characteristic of the devices of FIGS. 4A, 4B and 4C is obtained as shown in FIG. 5.

Figure 5:
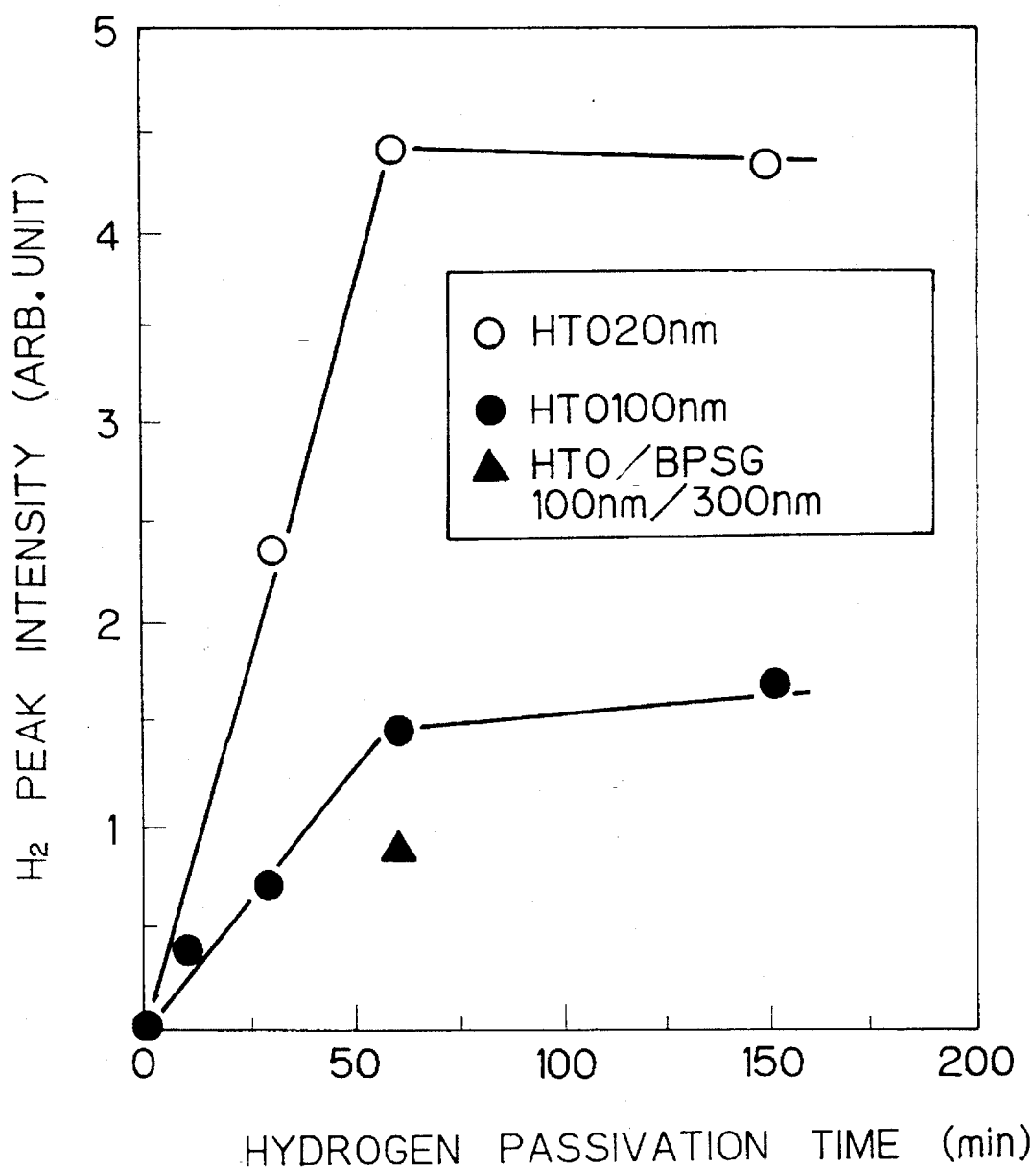
FIG. 5 is a graph showing a hydrogen peak intensity characteristic of the devices of FIGS. 4A, 4B, and 4C dependent upon a hydrogen passivation time period.

As is clear from FIG. 5, the amount of hydrogen trapped in the device of FIG. 4A having the 20 nm thick HTO layer 6A is about three times as large as that trapped in the device of FIG. 4B having the 100 nm thick HTO layer 6B. Also, the amount of hydrogen trapped in the device of FIG. 4C having a stacked configuration is not as small as that trapped in the device of FIG. 4B, in spite of the presence of the BPSG layer 7. This means the BPSG layer 7 hardly affects the hydrogen passivation. In other words, the diffusion speed of hydrogen within the BPSG layer 7 is larger than that within the HTO layer 6A (6B).

In view of the foregoing, in the present invention, the non-doped HTO layer 6A (6B) is as thin as possible to diffuse hydrogen therethrough, and as a result, the reduced thickness of a required insulating layer is compensated for by increasing the thickness of the BPSG layer 7.

An embodiment of the present invention will now be explained with reference to FIGS. 6A through 6F.

Figure 6A:
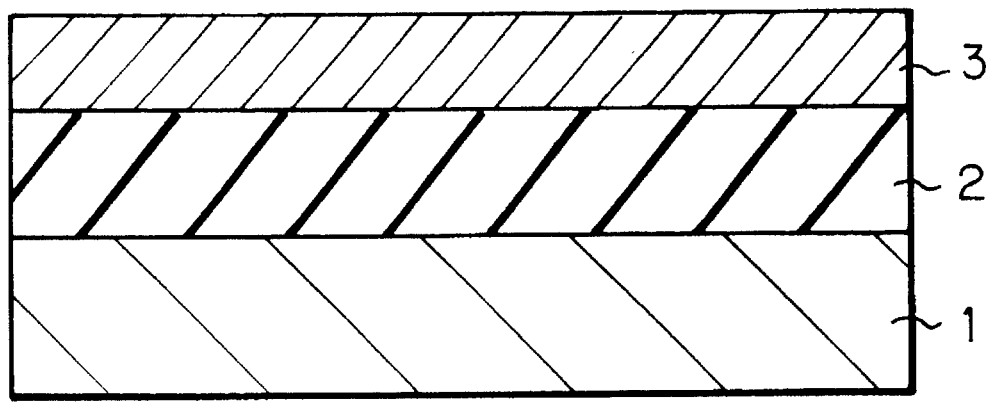
FIGS. 6A through 6F are cross-sectional views showing an embodiment of the method for manufacturing a TFT according to the present invention.

First, referring to FIG. 6A, an about 600 nm thick silicon oxide layer 2 is grown by thermally oxidizing a monocrystalline silicon substrate 1, Next, an about 100 nm thick amorphous silicon layer is deposited by an LPCVD process at a substrate temperature of about 500° C. with a source gas of $Si_2H_6$, the amorphous silicon is heated for about 12 hours at a temperature of about 600° C. in a nitrogen atmosphere to change the amorphous silicon into a polycrystalline silicon layer 3.

Figure 6B:
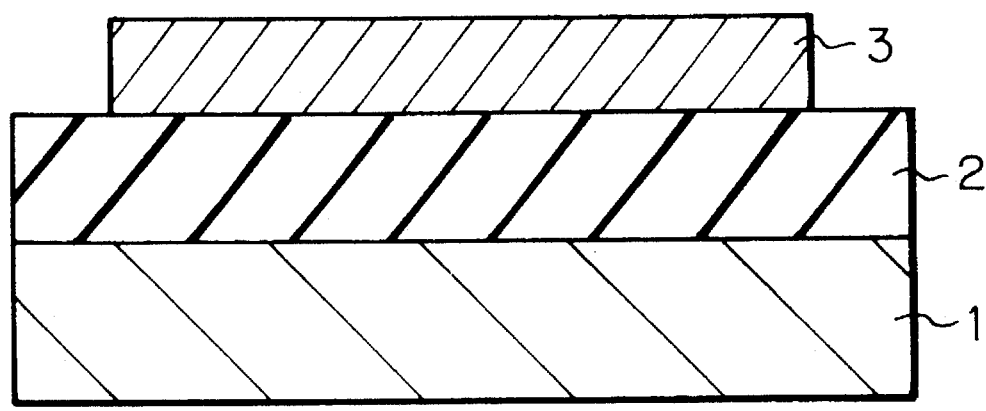

Next, referring to FIG. 6B, the polycrystalline silicon layer 3 is patterned into an island.

Figure 6C:
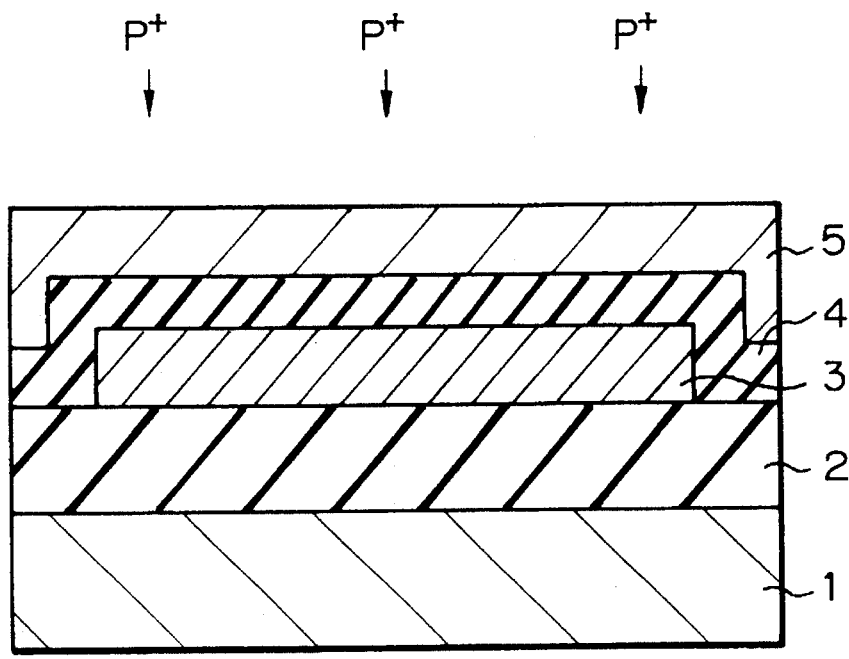

Next, referring to FIG. 6C, an about 100 nm thick gate silicon oxide layer 4 is formed by an LPCVD process. Then, an about 150 nm thick gate electrode layer 5 made of polycrystalline silicon is formed, and phosphorous ions are doped thereinto.

Figure 6D:
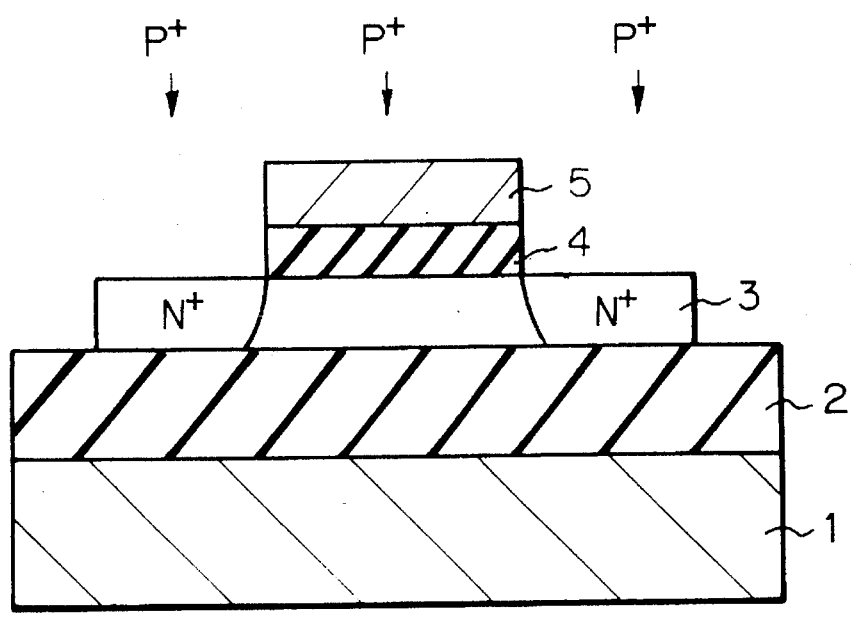

Next, referring to FIG. 6D, the gate electrode layer 5 and the gate insulating layer 4 are patterned. Then, 1×10$^{15}$ phosphorous ions/cm$^2$ are implanted into the polycrystalline silicon layer 3 in self-alignment with the patterned gate electrode layer 5. As a result, a source region (N$^+$) and a drain region (N$^+$) are formed within the polycrystalline silicon layer 3.

Figure 6E:
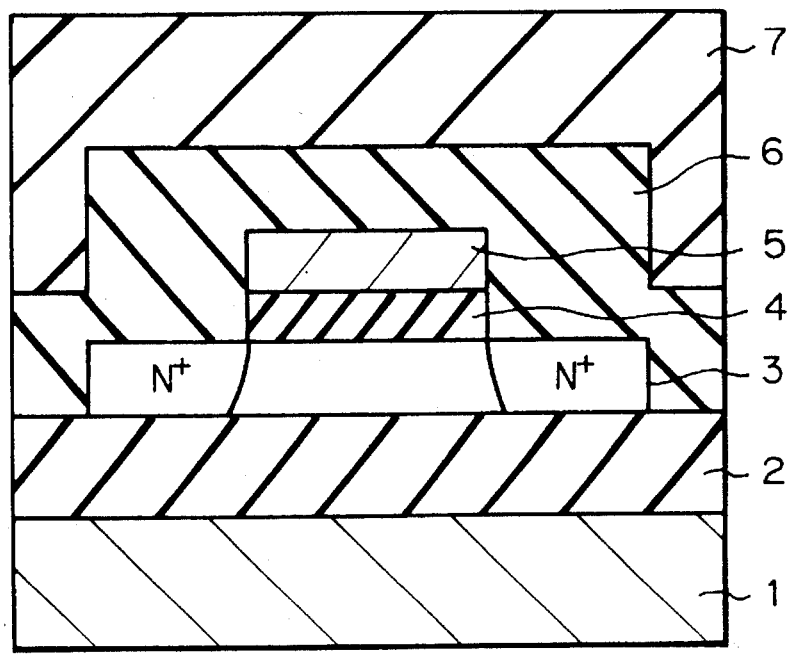

Next, referring to FIG. 6E, an about 100 nm thick non-doped HTO layer 6 is formed by an LPCVD process, and then, an about 300 nm thick BPSG layer 7 is formed by an APCVD process. Then, a heat operation is carried out at about 900° C. for about 30 minutes to anneal the source and drain regions and flatten the BPSG layer 7. In this case, the non-doped HTO layer 6 protects the active region of the TFT, i.e., the polycrystalline silicon layer 3. Also, since the BPSG layer 7 includes impurities such as boron and phosphorous, the non-doped HTO layer 6 prevents such impurities from being diffused into the polycrystalline silicon layer 3.

Figure 6F:
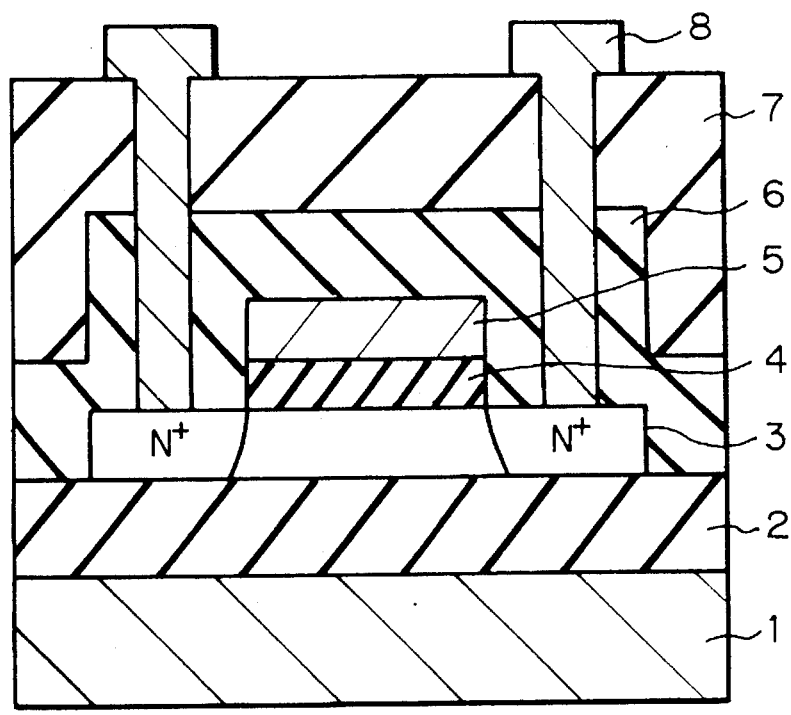

Finally, referring to FIG. 6F, contact holes are formed within the BPSG layer 7 and the non-doped HTO layer 6. The contact holes are opened to the source and drain regions of the polycrystalline silicon layer 3. After that, an about 500 nm thick 1% AlSi layer 8 is formed, and then, the device is sintered at a temperature of about 450° C. for 30 minutes with a forming gas. Finally, a hydrogen passivation is carried out in a parallel-plate plasma reactor at a substrate temperature of about 350° C. with $H_2$ gas at a power density of 0.28 W/cm$^2$ and a frequency of 13.56 KHz.

Figure 7:
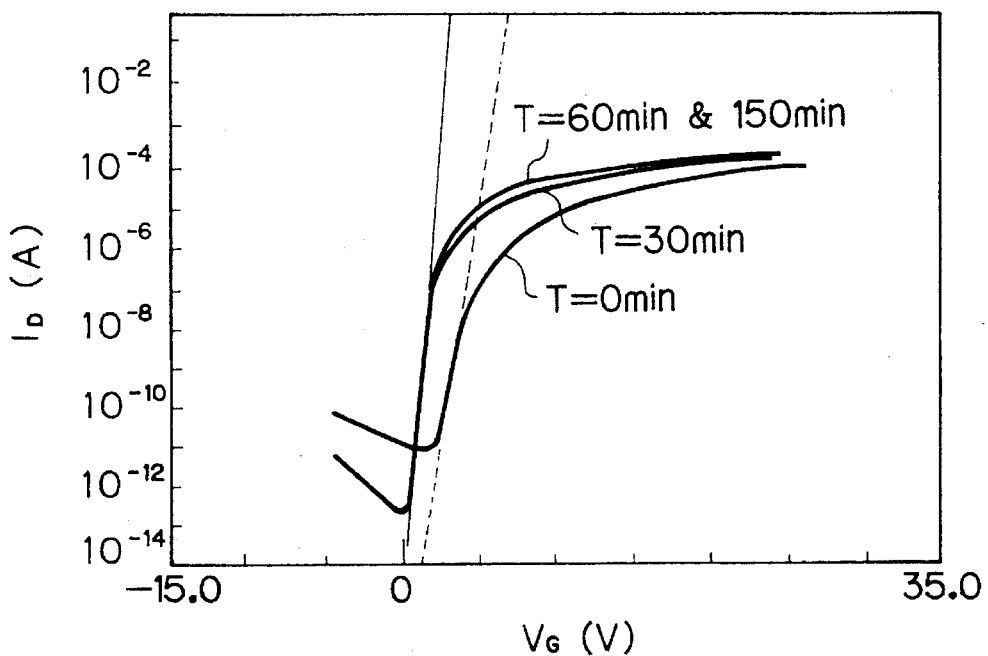
FIG. 7 is a graph showing an $I_D$–$V_G$ characteristic of the TFT of FIG. 6F.
Figure 8:
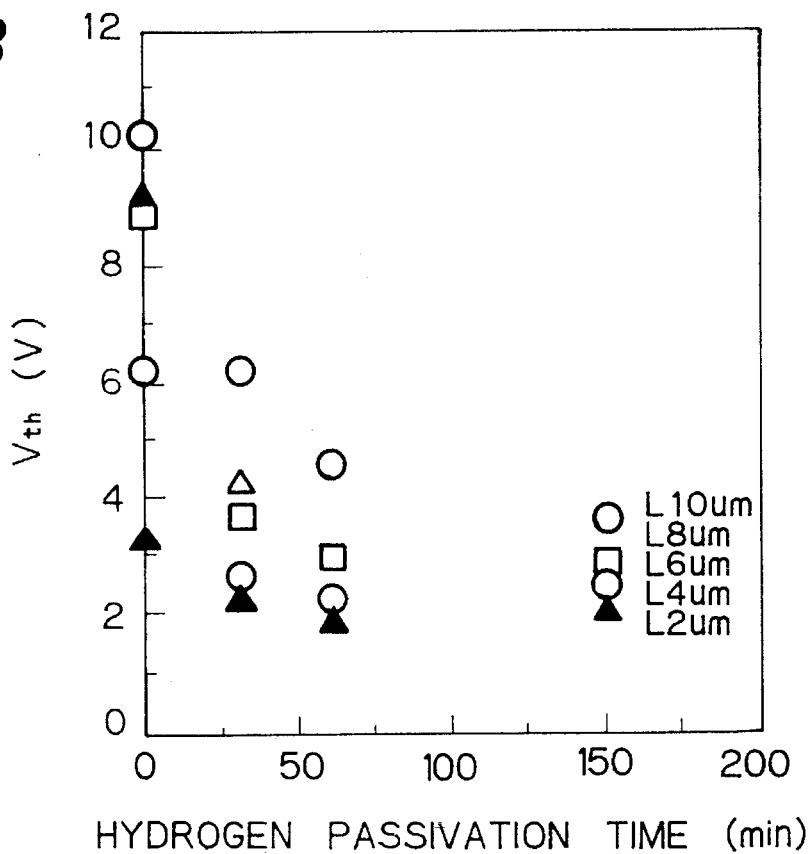
FIG. 8 is a graph showing a threshold voltage characteristic of the TFT of FIG. 6F dependent upon a hydrogen passivation time period.

FIG. 7 shows a drain current ($I_D$) to a gate voltage ($V_G$) characteristic of the TFT of FIG. 6F, and FIG. 8 shows a threshold voltage characteristic of the TFT of FIG. 6F. As shown in FIGS. 7 and 8, the hydrogen passivation time is at least 60 minutes. Also, when the hydrogen passivation time is about 150 minutes, a saturated hydrogen passivation effect is obtained, even in a long channel such as 10 μm applied to an LCD.

Figure 9:
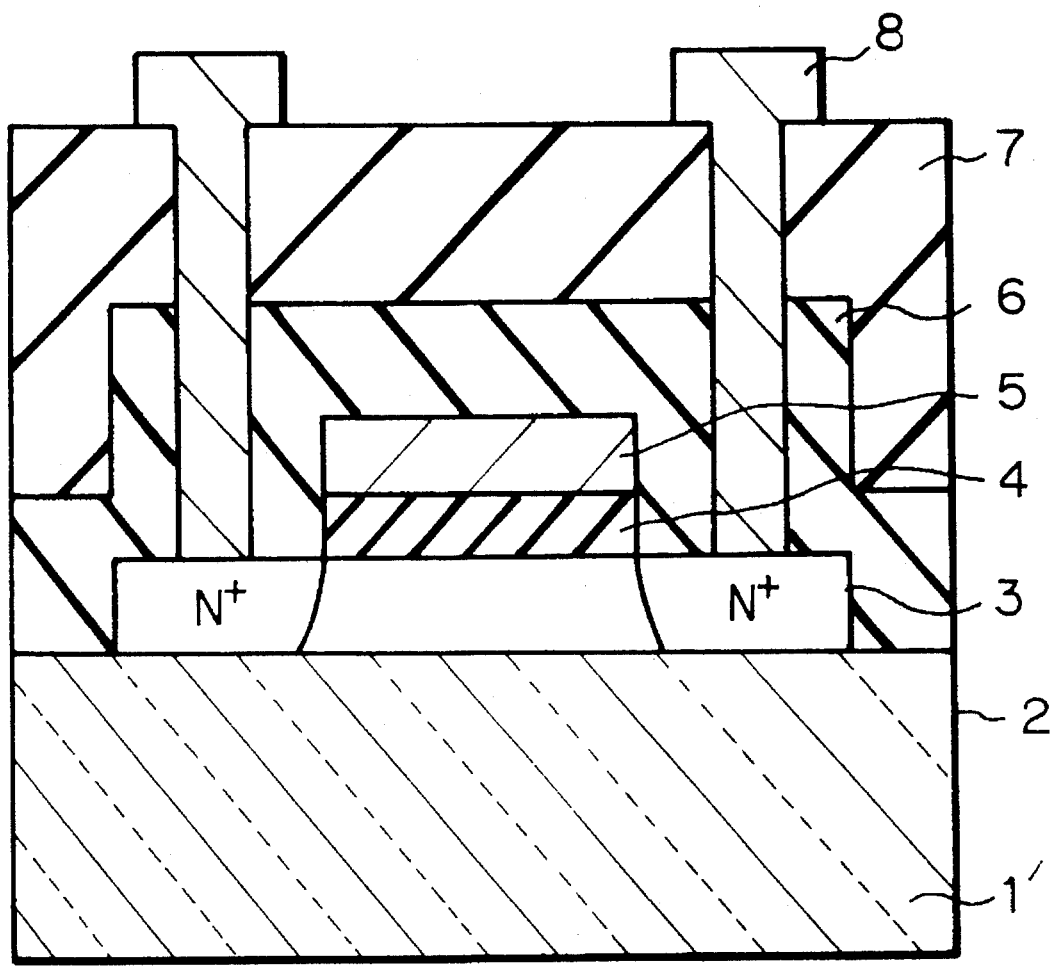
FIG. 9 is a cross-sectional view illustrating a modification of the TFT of FIG. 6F.

In FIG. 9, which is a modification of the TFT of FIG. 6F, a fused quartz substrate, i.e., an insulating substrate 1' is provided instead of the silicon monocrystalline substrate 1 and the silicon oxide layer 2 of FIG. 6F. Also, in this case, the same effect as in the above-mentioned embodiment can be obtained.

Also, a low temperature silicon oxide (LTO) layer or a plasma silicon oxide layer can be used instead of the HTO layer 6.

As explained hereinbefore, according to the present invention, since the thickness of a non-doped insulating layer for protecting a TFT is reduced, hydrogen passivation time can be reduced.

I claim:

1. A method for manufacturing a thin film transistor, comprising the steps of:

forming a polycrystalline silicon layer on a substrate;

forming a gate insulating layer on said polycrystalline silicon layer;

forming a gate electrodes layer on said gate insulating layer;

patterning said gate electrode layer and said gate insulating layer;

introducing impurity ions into said polycrystalline silicon layer in self-alignment with said patterned gate electrode layer to create source and drain regions in said polycrystalline silicon layer;

forming a non-doped insulating layer on said patterned gate electrode layer and said polycrystalline silicon layer, said non-doped insulating layer having a thickness of less than approximately 100 nm;

patterning said non-doped insulating layer;

forming a metal connection layer over said patterned non-doped insulating layer; and performing hydrogen passivation upon said polycrystalline silicon layer after said metal connection layer is formed.

2. A method as set forth in claim 1, wherein said non-doped insulating layer forming step forms said non-doped insulating layer by a LPCVD process.

3. A methyl as set forth in claim 1, wherein said non-doped insulating layer is made of at least one of HTO, LTO and plasma silicon oxide.

4. A method as set forth in claim 1, further comprising a step of forming an impurity-doped insulating layer on said non-doped insulating layer, said non-doped insulating layer patterning step further including a step of patterning said impurity-doped insulating layer.

5. A method as set forth in claim 4, wherein said impurity-doped insulating layer is made of BPSG.

6. A method as set forth in claim 1, wherein said hydrogen passivation step carries out the hydrogen passivation using hydrogenation by plasma discharge.

7. A method as set forth in claim 1, wherein said hydrogen passivation performing step carries out the hydrogen passivation for a time period less than approximately 150 minutes.

8. A method as set forth in claim 1, wherein said hydrogen passivation performing step carries out the hydrogen passivation for a time period of approximately 60 to 150 minutes.

9. A method as set forth in claim 1, wherein said substrate is made of a monocrystalline silicon substrate and a silicon oxide layer formed by thermally oxidizing said monocrystalline silicon layer.

10. A method as set forth in claim 1, wherein said substrate is made of insulating material.

11. A method as set forth in claim 1, wherein said polycrystalline silicon layer forming step comprises the steps of:

forming an amorphous silicon layer on said substrate; and performing a heat operation upon said amorphous silicon layer under a nitrogen atomsphere, to thereby change said amorphous silicon layer into said polycrystalline silicon layer.

12. A method for manufacturing a thin film transistor, comprising the steps of:

forming a polycrystalline silicon layer on a substrate;

forming a gate insulating layer on said polycrystalline silicon layer;

forming a gate electrode layer on said gate insulating layer;

patterning said gate electrode layer and said gate insulating layer;

introducing impurity ions into said polycrystalline silicon layer in self-alignment with said patterned gate electrode layer to create source and drain regions in said polycrystalline silicon layer;

forming a non-doped insulating layer on said patterned gate electrode layer and said polycrystalline silicon layer by an LPCVD, said non-doped insulating layer having a thickness of less than approximately 100 nm;

patterning said non-doped insulating layer to form contact holes opened to said source and drain regions;

forming a metal connection layer on said patterned non-doped insulating layer; and performing hydrogen passivation by plasma discharge upon said polycrystalline silicon layer after said metal connection layer is formed.

13. A method for manufacturing a thin film transistor, comprising the steps of:

forming a polycrystalline silicon layer on a substrate;

forming a gate insulating layer on said polycrystalline silicon layer;

forming a gate electrode layer on said gate insulating layer;

patterning said gate electrode layer and said gate insulating layer;

introducing impurity ions into said polycrystalline silicon layer in self-alignment with said patterned gate electrode layer to create source and drain regions in said polycrystalline silicon layer;

forming a non-doped insulating layer on said patterned gate electrode layer and said polycrystalline silicon layer by an LPCVD, said non-doped insulating layer having a thickness of less than approximately 100 nm;

forming an impurity-doped BPSG layer on said non-doped insulating layer;

patterning said non-doped insulating layer and said BPSG layer to form contact holes opened to said source and drain regions;

forming a metal connection layer on said patterned BPSG layer and non-doped insulating layer; and performing hydrogen passivation by plasma discharge upon said polycrystalline silicon layer after said metal connection layer is formed.

* * * * *